United States Patent [19]

Arya et al.

[11] Patent Number: 4,749,454
[45] Date of Patent: Jun. 7, 1988

[54] METHOD OF REMOVING ELECTRICAL SHORTS AND SHUNTS FROM A THIN-FILM SEMICONDUCTOR DEVICE

[75] Inventors: Rajeewa R. Arya, Doylestown; Robert S. Oswald, Newtown, both of Pa.

[73] Assignee: Solarex Corporation, Rockville, Md.

[21] Appl. No.: 931,072

[22] Filed: Nov. 17, 1986

[51] Int. Cl.$^4$ .............................................. C25F 3/12
[52] U.S. Cl. ............................. 204/129.3; 204/129.6; 204/129.95
[58] Field of Search ........... 204/129.3, 129.75, 129.95, 204/129.6

[56] References Cited

U.S. PATENT DOCUMENTS

| | | | |
|---|---|---|---|
| 2,963,411 | 12/1960 | Scott | 204/129.75 X |
| 3,122,464 | 2/1964 | Krynock | 204/129.95 X |
| 3,379,625 | 4/1968 | Csabi | 204/129.3 X |
| 3,518,131 | 6/1970 | Glendinning | 204/129.3 |
| 3,649,488 | 3/1972 | Pitetti et al. | 204/129.3 |
| 4,385,971 | 5/1983 | Swartz | 204/129.3 X |
| 4,464,823 | 8/1984 | Izu et al. | 204/129.6 X |
| 4,543,171 | 9/1985 | Firester et al. | 204/129.3 |

Primary Examiner—Donald R. Valentine
Attorney, Agent, or Firm—Finnegan, Henderson, Farabow, Garrett & Dunner

[57] ABSTRACT

A method of removing electrical shorts and shunts from a thin-film semiconductor device having pairs of electrodes with exposed contact surfaces wherein each pair of electrodes is separated by a semiconductor film. The disclosed method comprises the steps of coating the exposed contact surfaces with an ionic solution and successively applying a reverse-bias voltage between the exposed contact surfaces of each pair of electrodes. The ionic solution has an etching rate that increases with increased temperature so that the leakage current flowing through shorts and shunts located between each respective pair of electrodes in response to the reverse-bias voltage will create a local temperature increase at the shorts and shunts and selectively etch or oxidize the shorts and shunts, rendering them substantially nonconductive. The exposed contact surfaces can be coated using a sponge applicator or spray apparatus. The preferred ionic solution comprises an acid mixture diluted to one part in at least five parts water.

31 Claims, 1 Drawing Sheet

METHOD OF REMOVING ELECTRICAL SHORTS AND SHUNTS FROM A THIN-FILM SEMICONDUCTOR DEVICE

BACKGROUND OF THE INVENTION

1. Field of the Invention

The present invention relates to a method of improving performance of thin-film semiconductor devices having pairs of electrodes separated by a semiconductor film and containing electrical shorts or shunts. More particularly, the present invention relates to a method of electrochemically removing the effect of electrical shorts and shunts contained in large-area photovoltaic modules.

2. Description of the Related Art

As is well known in the art, the performance of thin-film amorphous silicon photovoltaic devices is adversely affected as the active surface of the device is increased. This phenomonon is primarily due to the creation of electrical shorts and shunts during fabrication of large-area photovoltaic devices.

In a conventional p-i-n or n-i-p amorphous silicon photovoltaic module comprised of a plurality of photovoltaic cells, each cell is comprised of a thin-film active semiconductor body, typically including a plurality of layers of semiconductor material, sandwiched between two conducting electrodes. Electrical shorts occur when the two electrodes come into electrical contact through a conductive metal path extending through the semiconductor body. This path can be caused by a local point defect, which either prevents the formation of the semiconductor layers during manufacture of the device, which typically is by a glow discharge deposition process, or causes the semiconductor layers to be peeled off. An electrical shunt is the loss of charge in the semiconductor body due either to an imperfect rectifying barrier or to the formation of an ohmic contact via a high work-function metal.

A conventional multi-cell hydrogenated amorphous silicon (a-Si:H) photovoltaic module of the type used for recharging electrical storage batteries is shown schematically in FIG. 1 and designated generally by reference numeral 6. The module 6 of FIG. 1 comprises n series-connected photovoltaic cells 8 formed on a substrate 10. Each cell 8 comprises a front electrode 12 formed of a conductive transparent oxide (CTO), a thin-film semiconductor body 14 typically formed of a-Si:H and its alloys in a p-i-n structure, and a metallic back electrode 16. As shown in FIG. 1, the ith cell 8(i) is comprised of front electrode 12(i), thin-film semiconductor body 14(i), and back electrode 16(i). Grooves formed between adjacent front electrodes 12(i) and 12(i+1) are filled with the amorphous silicon material forming overlying semiconductor body 14(i) to electrically insulate the adjacent front electrodes from each other. Adjacent semiconductor bodies 14(i) and 14(i+1) also are separated by a groove 13 to expose the underlying front electrode 12(i+1) and permit the formation of the series connections between adjacent cells.

With reference to FIG. 2, which shows a portion of module 6 of FIG. 1 during an intermediate stage of fabrication, the back electrodes 16 and the series connections between adjacent cells typically are formed by first depositing a layer 16' of a metal such as aluminum to cover the photovoltaic bodies 14(1) through 14(n). Then, the portions of metal layer 16' within width dimension w at each cell are removed by, for example, chemical etching or laser scribing to separate adjacent back electrodes 16 while retaining the connection between each metal back electrode 16(i) and the adjacent CTO front electrode 12(i+1), as shown in FIG. 1. The resulting back electrodes 16 are approximately L-shaped in cross section, each having one portion 16a of thickness $t_1$ overlying semiconductor body 14 and a second interconnection portion 16b of thickness $t_2$ that contacts the adjacent CTO front electrode. Thickness $t_1$ of portion 16a normally is greater than thickness $t_2$ of portion 16b.

The point defects that typically cause shorts and shunts in conventional devices are shown schematically in FIG. 1 and are designated by reference numeral 20. The density of these point defects has been found to increase rapidly as the surface area of the device is increased. Although the origin of these defects is not completely understood, they might be caused during the deposition of the CTO electrodes, by improper cleaning of the CTO electrodes prior to the deposition of the amorphous silicon semiconductor bodies, or due to dust generation during the deposition of amorphous silicon. Whatever the actual cause of these point defects, they lead to a reduction in the output and efficiency of large-area photovoltaic modules.

Attempts have been made in the art to remove electrical shorts and shunts from a thin-film photovoltaic device by applying a reverse-bias voltage to the device. A reverse-bias voltage is defined as an applied voltage having a polarity opposite that of the photovoltage generated by the device when exposed to light. When free of defects, the semiconductor material in the photovoltaic device ideally will act as a diode and prevent current flow from being induced by the reverse-bias voltage. (In actuality, a nominal leakage current called "reverse saturation current" will be induced by a reverse-bias voltage even in a "defect-free" cell.) When point defects exist, the leakage current flows at relatively low resistance through these defects. If the reverse-bias voltage is sufficiently high, the leakage current will be large enough to burn out or oxidize the electrodes at the point defects, thus effectively rendering the defects non-conductive and "curing" the device. The usefulness of such dry reverse-bias electrical curing is limited, however, because the high reverse-bias voltage required to oxidize the electrodes at the defects often produces new shorts and shunts.

Several methods of electrochemical curing using reverse-bias voltage also have been tried in the past. For example, U.S. Pat. No. 4,543,171 to Firester et al. discloses a method wherein a photovoltaic device having exposed aluminum electrodes is immersed in a liquid or gaseous bath of a chemical etchant consisting of an aluminum-etching acid mixture diluted to one part in three parts water or a gaseous composition of, for example, hydrochloric acid or flourine. The etchant has an etching rate that increases with increased temperature so that, when a reverse-bias voltage is applied to the photovoltaic device immersed in the etchant bath, localized heating of the exposed electrodes occurs at the shunts and shorts, where the leakage current flows at a relatively high current density. The localized heating increases the etching rate of the etchant at the shorts and shunts and causes the etchant to etch away or oxidize the exposed electrodes at the defects, thereby rendering the defects non-conductive.

Certain precautions must be made, however, to prevent the method disclosed by Firester et al. from damaging rather than curing the device. For example, Firester et al. teach that it is important to have a thin barrier layer of titanium between the semiconductor body and the exposed aluminum (or silver) electrode to prevent damage to the immersed device while the reverse-bias voltage is applied. Furthermore, Firester et al. teach forming a passivation layer of $SiO_2$ or an organic resin over the exposed electrode to mask portions of the exposed electrode from etching. This passivation layer must be removed before the module can be used, hence increasing the number of manufacturing process steps required.

We have found that, when the method disclosed by Firester et al. is applied to a conventional large-surface-area multi-cell photovoltaic module such as that shown in FIG. 1 lacking protective barrier and passivation layers, the photovoltaic module typically is damaged by chemical etching at locations remote from the shunts and shorts, particularly at the interconnections between adjacent cells. Although the precise cause of the damage is uncertain, we believe that two plausible explanations exist. First, the electrical connection at the interface between a metallic back electrode 16(i) and the adjacent CTO front electrode 12(i+1) might not be a perfect ohmic connection so that a local temperature increase results at the interface during the application of the reverse-bias voltage. As a consequence, the etching rate of the etching solution would be increased at the interface with a resulting unintended removal of electrode material. Second, in the absence of a passivation layer, the liquid etching ambient disclosed by Firester et al. will etch the aluminum of back electrodes 16 at the interconnection portion 16b, where the material has the small thickness $t_2$, even at room temperature. Consequently, the longer the photovoltaic module is immersed in the etching ambient, the greater the likelihood that etching at undesirable locations will take place.

The present invention is directed to providing an improved method of electrochemically etching electrical shorts and shunts to effectively remove them from a thin-film semiconductor device without causing damage to the interconnections between adjacent cells.

The present invention also is directed to providing a method of effectively removing electrical shorts and shunts from a thinfilm semiconductor device that does not require an elaborate etchant bath chamber.

Additional advantages of the present invention will be set forth in part in the description that follows and in part will be obvious from that description or can be learned by practice of the invention. The advantages of the invention can be realized and obtained by the method particularly pointed out in the appended claims.

SUMMARY OF THE INVENTION

The present invention overcomes the problems of the prior art methods of removing the effects of electrical shorts and shunts from thin-film semiconductor devices by coating the exposed electrodes of the devices with a highly diluted ionic solution as an ambient etching substance and applying a reverse-bias voltage across each individual pair of electrodes having a thin-film semiconductor body sandwiched therebetween.

To overcome the problems of the prior art methods and in accordance with the purpose of the invention, as embodied and broadly described herein, the method of this invention for removing the effects of electrical shorts and shunts from a thin-film semiconductor device having at least one pair of electrodes with exposed contact surfaces, wherein the pair of electrodes has a semiconductor film sandwiched therebetween, comprises the steps of coating the exposed contact surfaces with an ionic solution having an etching rate that increases with increased temperature and applying a reverse-bias voltage between the pair of electrodes for a sufficient period of time to render substantially nonconductive the shorts and shunts located between the pair of electrodes.

Broadly, the reverse-bias voltage is applied until the leakage current density, that is, the density of the current flowing through the shorts and shunts in response to the reverse-bias voltage, is less than or equal to about 3 $mA/cm^2$. The ionic solution preferably is an acid comprised of a mixture of approximately 15 parts acetic acid, 75 parts phosphoric acid, 8 parts nitric acid, and 2 parts water diluted to one part in at least five parts water. The reverse-bias voltage preferably is applied at about 1 to 6 volts.

In a preferred embodiment the method of the invention is performed on a multi-cell photovoltaic module having an insulating substrate on one side and a plurality of pairs of electrodes with back contact surfaces exposed on a second side. Each pair of electrodes has a thin-film amorphous semiconductor body sandwiched therebetween to form a cell, and adjacent cells have series connections therebetween. The second side of the module is coated with an ionic solution, and a reverse-bias voltage is applied across each of the cells for a sufficient period of time to render substantially nonconductive the shorts and shunts in the cells without damaging the series connections.

The accompanying drawings, which are incorporated in and which constitute a part of this specification, explain, together with the description, the principles of the invention.

DESCRIPTION OF THE PREFERRED EMBODIMENT

Figure 1:
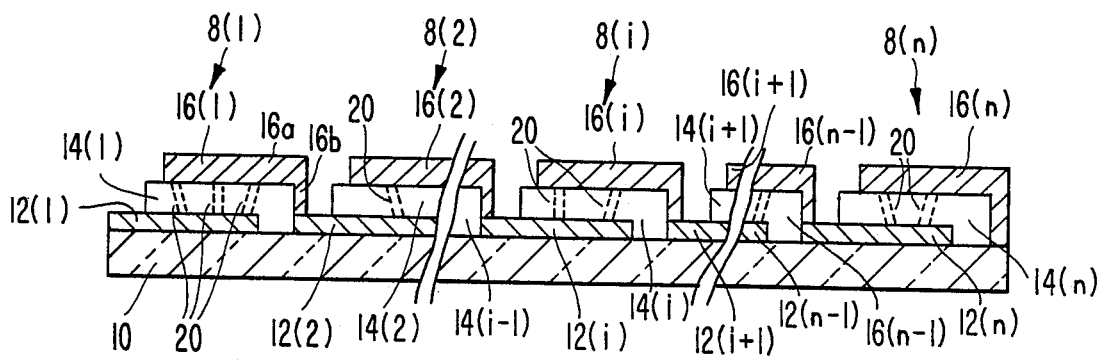
FIG. 1 is a schematic cross-sectional view of a amorphous silicon photovoltaic module to which the method of this invention is applied.
Figure 2:
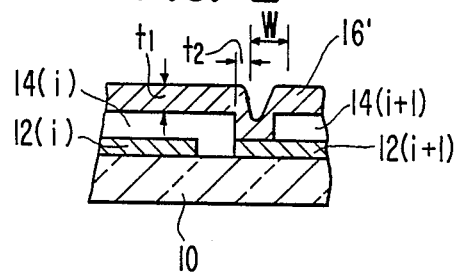
FIG. 2 is a schematic cross-sectional view of a portion of the photovoltaic module of FIG. 1 prior to chemical etching or laser scribing of the back contacts.

Reference now will be made in detail to the presently preferred embodiment of the invention, as applied to the photovoltaic device shown in the drawings.

The photovoltaic module 6 shown in FIG. 1 includes point defects 20 comprised of shorts or shunts that electrically connect pairs of electrodes 12(i) and 16(i). These point defects lower the performance of the individual cells and of the photovoltaic module as a whole.

In accordance with the method of this invention, the effects of the electrical shorts and shunts are removed by coating the "back" side, that is, the side of the module on which back electrodes 16 are exposed, with an ionic solution having an etching rate with respect to the exposed electrodes that increases with increased temperature. When the back electrodes are formed of aluminum, the ionic solution preferably consists of an acid mixture diluted to more than five times its concentration (by volume) with water, wherein the acid mixture is comprised of approximately 15 parts by volume acetic acid, 75 parts by volume phosphoric acid, 8 parts by volume nitric acid, and 2 parts by volume water. The presently preferred dilution of the above acid mixture is approximately one part acid mixture to six parts (by volume) water. The ionic solution can be applied without expensive apparatus, for example, with a sponge applicator or with a sprayer.

In accordance with the invention, after the back electrodes of the photovoltaic module have been coated with the ionic solution, each individual cell is successively subjected to a reverse bias voltage. The voltage is applied first between front electrode 12(1) situated at one end of module 6 and back electrode 16(1), then between back electrodes 16(1) and 16(2), then between back electrodes 16(2) and 16(3), and so on. Of course, the reverse-bias voltage can be applied in any order desired. For modules having aluminum back electrodes of about 7000Å in thickness, the reverse-bias voltage preferably is applied at approximately 1 to 6 volts until the point defects are removed, that is, rendered nonconductive. When the preferred acid mixture diluted to about one in six parts water is used as the ionic solution and a reverse-bias voltage of 6 volts is applied, the method of this invention cures each cell in about 5–7 seconds. Preferably, the module then is rinsed thoroughly in de-ionized water and blown dry.

The method of this invention provides a simple and inexpensive process for turning photovoltaic modules that normally would be scrapped because of the presence of point defects incurable by prior art methods into reliable, marketable products. The duration of the reverse-bias voltage required to remove the point defects will depend on a number of factors, including the size and density of the point defects, the thicknesses $t_1$ and $t_2$ of the back electrodes, and the etching strength of the ionic solution.

Although the best results for photovoltaic modules with 7000Å-thick aluminum back electrodes have been obtained with the preferred acid mixture of acetic acid, phosphoric acid, nitric acid, and water diluted with water in a 1:6 volume ratio, the method of this invention can utilize any ionic solution, be it acidic, alkaline, or a neutral electrolyte. The method can employ ordinary tap water as the ionic solution, at least when the exposed electrodes are comprised of aluminum. We believe that the water reacts with aluminum to form nonconductive aluminum hydroxide ($Al(OH)_3$) at the point defects. When tap water is used as the ionic solution and the method is applied to a photovoltaic module with aluminum back electrodes about 7000Å thick, a reverse-bias voltage of approximately 5 volts applied to each cell for 1–2 minutes has been effective to render typical point defects nonconductive. Of course, the applicability of water as the ionic solution also will depend upon the ionic content of the local tap water.

In practice, the reverse-bias voltage can be applied to each cell for as long as the cell conducts a substantial leakage current, which can be monitored easily by conventional techniques. When the reverse-bias voltage is applied, there is localized heating at the shorts and shunts 20 due to the passage of all of the current through the point defects. Any ionic solution having a rate of reaction that increases with an increase in temperature will undergo a differential reaction rate at the defect sites relative to the remaining portions of the cell coated with the solution. Thus, wherever there are point defects, the electrodes are physically removed by etching or rendered non-conductive by oxidation at a faster rate than elsewhere. Once the defects are removed or rendered non-conductive, the cell will act as a diode, and no substantial leakage current will flow in response to the reverse-bias voltage. Consequently, the reverse-bias voltage can be applied until the leakage current stops or, preferably, until it produces a preselected minimum leakage current density (based on the area of the exposed electrode), such as, for example, 3 $mA/cm^2$.

The method of the present invention has the advantage of being performable at room temperature. Care must be taken, however, to sufficiently dilute any acid solution that will etch the exposed electrodes at room temperature. Because it takes a certain amount of time to apply the reverse-bias voltage across each cell of a large-area multi-cell module, the acid solution will etch the metal back electrodes 16 at interconnection portion 16b, where the thickness of the metal layer 16' is less than at portion 16a, irrespective of whether point defects are present. If the etching of portion 16b is excessive, the overall series resistance of the module will increase. For example, the etching rate of aluminum at room temperature with the preferred acid solution diluted with water to a ratio of 1:6 is approximately 2Å/sec. With an acid solution of this dilution, it typically takes approximately 150 to 200 seconds to cure 30 cells of a large-area module having aluminum back electrodes 7000Å thick at portions 16a. Therefore, if the thickness $t_2$ at the interconnection portions 16b is well over 400Å, there will be no adverse effect on the series resistance of the module. On the other hand, if the acid dilution ratio is 1:3, we have found that an undesirable increase in series resistance results, although overall performance of some modules improves.

The invention is illustrated further by the following examples, which apply the method of the present invention to defective or "reject" photovoltaic modules using ionic solutions of differing concentration.

Figure 3:
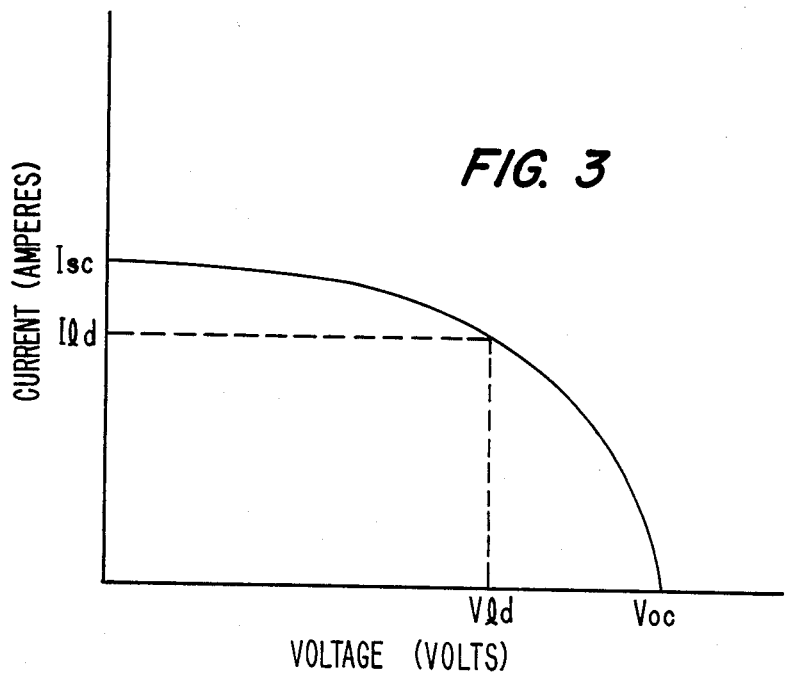
FIG. 3 is a plot of current versus voltage under illumination used for explaining how current at the module's designed load voltage is measured.

Photovoltaic modules designed for charging 12-volt electrical storage batteries were fabricated employing the general techniques disclosed, for example, in U.S. Pat. No. 4,064,521. Each module had the cross-sectional structure shown in FIG. 1 and consisted of thirty cells formed on a rectangular glass substrate measuring approximately 30 cm by 33 cm. The front electrodes 12 were formed of tin oxide approximately 5000Å thick. The semiconductor bodies 14 were approximately 5600Å thick and were formed as a p-i-n structure consisting of an a-SiC:H p-layer about 100Å thick, an a-Si:H i-layer about 5100Å thick, and an a-SiC:H n-layer about 400Å thick. The back electrodes 16 were aluminum about 7000Å thick at dimension $t_1$ in FIG. 1. After fabrication, the modules were subjected to a dry electrical cure, that is, without any etchant solution, in which a reverse-bias voltage of about 8 volts was applied across each cell. After the initial cure, the modules were tested under standardized illumination conditions to measure certain performance criteria, particularly the current (Ild) produced at a predetermined "load voltage" (Vld). The value of Ild is taken from the plot of output current versus voltage, an example of which is shown in FIG. 3. For the battery-charging modules described above, the load voltage is 17.5 volts and the desired value of Ild is 0.300 amp. Modules having a value of Ild less than 0.250 amps have heretofore been considered rejects and were scrapped.

EXAMPLE I

Five reject modules were subjected to electrochemical curing using the method of the present invention with a lightly diluted acid mixture. The back electrodes of the defective modules first were coated, using a sponge applicator, with an ionic solution consisting of an acid mixture of 15 parts acetic acid, 75 parts phosphoric acid, 8 parts nitric acid, and 2 parts water diluted to 1 in 3 parts water (all parts measured by volume). A reverse bias voltage of 6 volts then was applied across each cell unitl the leakage current density dropped to approximately 3 mA/cm$^2$. The modules were then rinsed in de-ionized water and retested.

In Table I the open circuit voltage (Voc), the short circuit current (Isc), the fill factor (FF), the efficiency, the current at the load voltage of 17.5 volts (Ild), and the overall series resistance (Rs) are given for each module both before and after electrochemical curing.

TABLE I

Effect of Electrochemical Curing on the Performance of Photovoltaic Modules Using 1:3 Acid Dilution

| Module # | Voc (V) | Isc (A) | FF | EFF. (%) | Ild (A) | Rs (Ohms) | Remarks |
|---|---|---|---|---|---|---|---|
| H248-9M | 18.701 | 0.389 | 0.58 | 4.90 | 0.110 | 10.33 | Before Cure |
|  | 24.583 | 0.393 | 0.64 | 7.13 | 0.344 | 11.07 | After Cure |
| T248-4F | 17.233 | 0.427 | 0.41 | 3.50 | 0.0 | 20.1 | Before Cure |
|  | 24.703 | 0.426 | 0.47 | 5.75 | 0.268 | 27.44 | After Cure |
| T248-4M | 17.941 | 0.419 | 0.41 | 3.58 | 0.023 | 19.5 | Before Cure |
|  | 23.410 | 0.418 | 0.48 | 5.45 | 0.248 | 22.71 | After Cure |
| H251-2R | 17.386 | 0.407 | 0.52 | 4.28 | 0.0 | 12.67 | Before Cure |
|  | 25.017 | 0.397 | 0.49 | 5.58 | 0.268 | 36.73 | After Cure |
| H251-4R | 17.367 | 0.38 | 0.53 | 4.07 | 0.0 | 12.26 | Before Cure |
|  | 24.113 | 0.37 | 0.34 | 3.52 | 0.157 | 32.98 | After Cure |

As is evident from Table I, use of a 1:3 acid dilution improved certain performance parameters for each module. Voc, efficiency, and Ild improved for all of the modules. Indeed, three of the five modules exhibited an increase in Ild to a value greater than 0.250 amp. The overall series resistance of the modules increased, however, when electrochemical curing was performed with a 1:3 acid dilution. We believe that this increase in resistance was due to the etching of a relatively strong acid solution at the interconnections between adjacent cells.

EXAMPLE II

Six reject modules, as well as three modules having values of Ild between 0.250 amp and 0.300 amp, were subjected to the same electrochemical curing method and testing performed on the modules in Example I, except that the ionic solution coated on the exposed electrodes consisted of the acid mixture of 15 parts acetic acid, 75 parts phosphoric acid, 8 parts nitric acid, and 2 parts water diluted to 1 in 6 parts water (all parts measured by volume). Table II sets forth the results before and after electrochemical curing of photovoltaic modules with the acid mixture diluted to 1:6.

TABLE II

Effect of Electrochemical Curing on the Performance of Photovoltaic Modules Using 1:6 Acid Solution

| Module # | Voc (V) | Isc (A) | FF | EFF. (%) | Ild (A) | Rs (Ohms) | Remarks |
|---|---|---|---|---|---|---|---|
| H252-10M | 19.647 | 0.389 | 0.57 | 5.08 | 0.172 | 11.12 | Before Cure |
|  | 24.085 | 0.389 | 0.62 | 6.74 | 0.330 | 8.4 | After Cure |
| H252-5M | 18.713 | 0.407 | 0.55 | 4.85 | 0.098 | 12.44 | Before Cure |
|  | 20.799 | 0.401 | 0.59 | 5.66 | 0.231 | 11.94 | After Cure |
| H252-2F | 20.130 | 0.402 | 0.55 | 5.17 | 0.182 | 12.56 | Before Cure |
|  | 24.995 | 0.404 | 0.64 | 7.45 | 0.358 | 11.76 | After Cure |
| H252-2M | 18.817 | 0.391 | 0.54 | 4.16 | 0.110 | 10.54 | Before Cure |
|  | 23.635 | 0.397 | 0.63 | 6.87 | 0.339 | 10.08 | After Cure |
| H252-7F | 18.394 | 0.395 | 0.48 | 4.07 | 0.061 | 14.54 | Before Cure |
|  | 24.491 | 0.394 | 0.58 | 6.47 | 0.320 | 10.64 | After Cure |
| H252-7M | 18.337 | 0.394 | 0.54 | 4.50 | 0.063 | 13.61 | Before Cure |
|  | 23.616 | 0.389 | 0.56 | 5.93 | 0.289 | 12.98 | After Cure |
| D1440 | 23.603 | 0.395 | 0.55 | 5.94 | 0.287 | 14.01 | Before Cure |
|  | 24.768 | 0.394 | 0.63 | 7.08 | 0.346 | 12.25 | After Cure |
| H161-2F | 23.521 | 0.359 | 0.57 | 5.59 | 0.276 | 11.60 | Before Cure |
|  | 23.944 | 0.378 | 0.64 | 6.73 | 0.330 | 8.72 | After Cure |
| H195-9R | 24.106 | 0.364 | 0.6 | 6.06 | 0.298 | 10.82 | Before Cure |
|  | 23.721 | 0.371 | 0.66 | 6.69 | 0.328 | 9.38 | After Cure |

By using a weaker acid solution, substantial increases in module performance criteria are obtainable, and overall series resistance of the modules is decreased. In addition, as shown with the last three modules listed in Table II, substantial improvements in efficiency, Ild, and series resistance can be obtained by practice of this invention on modules that would normally not be considered rejects. The last three modules each had an Ild greater than 0.250 amp before being electrochemically cured. Thus, they would have been considered acceptable but would not have achieved the desired Ild of 0.300 amp. After electrochemical curing, the efficiency of these three modules was improved by 10-20%, and each module exhibited an Ild above 0.300 amp.

As seen from the results in Tables I and II, the method of this invention provides for a remarkable increase in performance of photovoltaic modules by the removal of electrical shorts and shunts using a method having relatively low cost. No special immersion tanks or electrode contacts are required. Furthermore, better results are achieved when the ionic solution is more highly diluted, so that worker safety is enhanced.

It will be apparent to those skilled in the art that modifications and variations can be made in the method of this invention without departing from the scope of the invention. For example, although the process has been described with respect to a p-i-n amorphous silicon photovoltaic module having two electrodes of tin oxide and aluminum, the process will work for other electrode systems such as zinc oxide, indium-tin oxide, nichrome, silver, and titanium/silver by using etching solutions suitable for those materials. The process also will work for n-i-p photovoltaic cells, for single or stacked junction solar cells, and for other semiconductor devices in which shorts or shunts occur in a semiconductor body sandwiched between a pair of electrodes by virtue of a conductive path at a defect site. Furthermore, although the method of this invention has been described with respect to a multi-cell semiconductor device, it can be performed on a single-cell device. In addition, the method of this invention can be applied to only selected cells of a multi-cell device rather than to all the cells. The invention in its broader aspects is, therefore, not limited to the specific details and illustrated examples shown and described. Accordingly, it is intended that the present invention cover such modifications and variations provided that they fall within the scope of the appended claims and their equivalents.

What is claimed is:

1. A method of removing the effects of electrical shorts and shunts from a thin-film semiconductor device having at least one pair of electrodes with exposed aluminum contact surfaces, said pair of electrodes having a semiconductor film sandwiched therebetween, the method comprising the steps of:
   coating said exposed contact surfaces with an ionic solution having an etching rate that increases with increased temperature, said ionic solution comprising an acid diluted to one part in at least five parts water; and
   applying a reverse-bias voltage between said pair of electrodes for a sufficient period of time to render substantially non-conductive said shorts and shunts located between said pair of electrodes.

2. The method of claim 1, wherein said reverse-bias voltage is applied at about 1 to 6 volts.

3. The method of claim 1, wherein said acid comprises a mixture of approximately 15 parts acetic acid, 75 parts phosphoric acid, 8 parts nitric acid, and two parts water.

4. The method of claim 1, wherein said ionic solution comprises an acid mixture of about 15 parts acetic acid, 75 parts phosphoric acid, 8 parts nitric acid, and 2 parts water diluted to about one part acid mixture to six parts water.

5. The method of claim 4, wherein said device includes a plurality of pairs of said electrodes each having a semiconductor film sandwiched therebetween and said reverse-bias voltage is applied successively to each of said pairs of electrodes at about 6 volts for about 5 to 7 seconds.

6. The method of claim 1, wherein said coating step is performed with a sponge applicator.

7. The method of claim 1, wherein said coating step includes spraying said exposed contact surfaces with said ionic solution.

8. A method of removing the effects of electrical shorts and shunts from a thin-film semiconductor device having at least one pair of electrodes with exposed aluminum contact surfaces, said pair of electrodes having a semiconductor film sandwiched therebetween, the method comprising the steps of:
   coating said exposed contact surfaces with an ionic solution having an etching rate that increases with increased temperature, said ionic solution being tap water; and and
   applying a reverse-bias voltage between said pair of electrodes for a sufficient period of time to render substantially non-conductive said shorts and shunts located between said pair of electrodes.

9. The method of claim 8, wherein said device includes a plurality of pairs of said electrodes each having a semiconductor film sandwiched therebetween and said reverse-bias voltage is applied to each of said pairs of electrodes at about 5 volts for about 1 to 2 minutes.

10. A method of removing the effects of electrical shorts and shunts from a thin-film semiconductor device having at least one pair of electrodes with exposed aluminum contact surfaces, said pair of electrodes having a semiconductor film sandwiched therebetween, the method comprising the steps of:
    coating said exposed contact surfaces with an ionic solution having an etching rate that increases with increased temperature, said ionic solution comprising an acid diluted to one part in at least five parts water; and
    applying a reverse-bias voltage between said pair of electrodes to induce a leakage current flowing through said shorts and shunts located between said pair of electrodes until the current density of said leakage current decreases to a preselected minimum current density.

11. The method of claim 10, wherein said preselected minimum current density is approximately 3 mA/cm$^2$.

12. A method of removing the effects of electrical shorts and shunts from a thin-film semiconductor device having an insulating substrate on one side and a plurality of interconnected pairs of electrodes with contact surfaces exposed on a second side opposite said substrate, each pair of electrodes having a semiconductor film sandwiched therebetween, the method comprising the steps of:
    applying a coating of an ionic solution on said second side of said semiconductor device to cover substantially the entire area of said exposed contact surfaces without immersing said semiconductor device in said ionic solution, said ionic solution having an etching rate that increases with increased temperature;
    applying a reverse-bias voltage between one of said pairs of electrodes for a sufficient period of time to render substantially non-conductive said shorts and shunts located between said one pair of electrodes; and
    repeating said voltage applying step for each of said pairs of electrodes.

13. The method of claim 12, wherein said step of applying a coating is performed with a sponge applicator.

14. The method of claim 12, wherein said step of applying a coating includes spraying said exposed contact surfaces with said ionic solution.

15. A method of removing the effects of electrical shorts and shunts from a thin-film semiconductor device having an insulating substrate on one side and a plurality of interconnected pairs of electrodes with contact surfaces exposed on a second side opposite said substrate, each pair of electrodes having a semiconductor film sandwiched therebetween, the method comprising the steps of:
    applying a coating of an ionic solution on said second side of said semiconductor device to cover substantially the entire area of said exposed contact surface without immersing said semiconductor device in said ionic solution, said ionic solution having an etching rate that increases with increased temperature;

applying a reverse-bias voltage between one of said pairs of electrodes to induce a leakage current flowing through said shorts and shunts located between said one pair of electrodes until the current density of said leakage current decreases to a preselected minimum current density; and repeating said voltage applying step for each of said pairs of electrodes.

16. The method of claim 15, wherein said step of applying a coating is performed with a sponge applicator.

17. The method of claim 15, wherein said step of applying a coating includes spraying said exposed contact surfaces with said ionic solution.

18. A method of removing the effects of electrical shorts and shunts from a multi-cell photovoltaic module having an insulating substrate on one side and a plurality of pairs of electrodes with aluminum back contact surfaces exposed on a second side opposite said substrate, each pair of electrodes having a thin-film amorphous semiconductor body sandwiched therebetween to form a cell and adjacent cells having series connections therebetween, the method comprising the steps of:

coating said second side of said photovoltaic module with an ionic solution having an etching rate that increases with increased temperature, said ionic solution comprising an acid diluted to one part in at least five parts water; and applying a reverse-bias voltage across each of said cells for a sufficient period of time to render substantially non-conductive said shorts and shunts in said cells without damaging said series connections.

19. The method of claim 18, wherein said reverse-bias voltage is applied between said exposed back contact surfaces of adjacent cells.

20. The method of claim 18, wherein said reverse-bias voltage is applied at about 1 to 6 volts.

21. The method of claim 18, wherein said acid comprises a mixture of approximately 15 parts acetic acid, 75 parts phosphoric acid, 8 parts nitric acid, and two parts water.

22. The method of claim 18, wherein said ionic solution comprises an acid mixture of about 15 parts acetic acid, 75 parts phosphoric acid, 8 parts nitric acid, and 2 parts water diluted to about one part acid mixture to six parts water.

23. The method of claim 22, wherein said reverse-bias voltage is applied across each of said cells at about 6 volts for about 5 to 7 seconds.

24. The method of claim 15, wherein said coating step is performed with a sponge applicator.

25. The method of claim 15, wherein said coating step includes spraying said exposed contact surfaces with said ionic solution.

26. A method of removing the effects of electrical shorts and shunts from a multi-cell photovoltaic module having an insulating substrate on one side and a plurality of pairs of electrodes with aluminum back contact surfaces exposed on a second side opposite said substrate, each pair of electrodes having a thin-film amorphous semiconductor body sandwiched therebetween to form a cell and adjacent cells having series connections therebetween, the method comprising the steps of:

coating said second side of said photovoltaic module with an ionic solution having an etching rate that increases with increased temperature, said ionic solution being tap water; and applying a reverse-bias voltage across each of said cells for a sufficient period of time to render substantially non-conductive said shorts and shunts in said cells without damaging said series connections.

27. The method of claim 26, wherein said reverse-bias voltage is applied across each of said cells at about 5 volts for about 1 to 2 minutes.

28. A method of removing the effect of electrical shorts and shunts from a multi-cell photovoltaic module having an insulating substrate on one side and a plurality of pairs of electrodes with aluminum back contact surfaces exposed on a second side opposite said substrate, each pair of electrodes having a thin-film amorphous semiconductor body sandwiched therebetween to form a cell and adjacent cells having a series connection therebetween, the method comprising the steps of:

coating said second side of said photovoltaic module with an ionic solution having an etching rate that increases with increased temperature, said ionic solution comprising an acid diluted to one part in at least five parts water; and applying a reverse-bias voltage across each of said cells to produce a leakage current flowing through said shorts and shunts located between said respective pair of electrodes of each of said cells until the current density of said leakage current decreases to a preselected minimum current density, wherein said etching rate of said ionic solution is sufficient to etch said shorts and shunts without damaging said series connections.

29. The method of claim 28, wherein said reverse-bias voltage is applied between said exposed back contact surfaces of adjacent cells.

30. The method of claim 23, wherein said preselected minimum current density is approximately 3 mA/cm$^2$.

31. A method of removing the effects of electrical shorts and shunts from a multi-cell photovoltaic module having an insulating substrate on one side and a plurality of pairs of electrodes with back contact surfaces exposed on a second side opposite said substrate, each pair of electrodes having a thin-film amorphous semiconductor body sandwiched therebetween to form a cell and adjacent cells having series connections therebetween, the method comprising the steps of:

applying a coating of an ionic solution on said second side of said photovoltaic module to cover substantially the entire area of said exposed back contact surfaces without immersing said photovoltaic module in said ionic solution, said ionic solution having an etching rate that increases with increased temperature; and applying a reverse-bias voltage across each of said cells for a sufficient period of time to render substantially non-conductive said shorts and shunts in said cells without damaging said series connections.

* * * * *